(12) United States Patent
Zhu

(10) Patent No.: US 11,031,469 B2
(45) Date of Patent: Jun. 8, 2021

(54) SEMICONDUCTOR DEVICE, MANUFACTURING METHOD THEREOF, AND ELECTRONIC DEVICE INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 0 days.

(21) Appl. No.: 16/779,067

(22) Filed: Jan. 31, 2020

(65) Prior Publication Data

US 2020/0251557 A1    Aug. 6, 2020

(30) Foreign Application Priority Data

Feb. 3, 2019    (CN) .......................... 201910108694.3

(51) Int. Cl.
| | |
|---|---|
| *H01L 29/10* | (2006.01) |
| *H01L 21/22* | (2006.01) |
| *H01L 21/8234* | (2006.01) |
| *H01L 29/78* | (2006.01) |

(52) U.S. Cl.
CPC .......... *H01L 29/1033* (2013.01); *H01L 21/22* (2013.01); *H01L 21/823412* (2013.01); *H01L 29/78* (2013.01)

(58) Field of Classification Search
CPC ......... H01L 29/42392; H01L 29/66795; H01L 29/78642; H01L 29/66666; H01L 29/41741
See application file for complete search history.

(56) References Cited

U.S. PATENT DOCUMENTS

| | | | |
|---|---|---|---|
| 2019/0140080 A1* | 5/2019 | Lee .................. | H01L 29/41741 |
| 2019/0319118 A1* | 10/2019 | Lee .................. | H01L 29/66666 |

* cited by examiner

*Primary Examiner* — Changhyun Yi
(74) *Attorney, Agent, or Firm* — Hamre, Schumann, Mueller & Larson, P.C.

(57) ABSTRACT

A semiconductor device, a manufacturing method thereof, and an electronic device including the same are provided. According to an embodiment, the semiconductor device may include a substrate; a first source/drain region, a channel region and a second source/drain region stacked on the substrate in sequence and contiguous to each other, and a gate stack formed surrounding a periphery of the channel region; wherein spacers are respectively provided between the gate stack and the first source/drain region and between the gate stack and the second source/drain region in a form of surrounding the periphery of the channel region.

28 Claims, 8 Drawing Sheets

SEMICONDUCTOR DEVICE, MANUFACTURING METHOD THEREOF, AND ELECTRONIC DEVICE INCLUDING THE SAME

CROSS-REFERENCE TO RELATED APPLICATION(S)

This application claims priority to Chinese Patent Application No. 201910108694.3, filed on Feb. 3, 2019, entitled "SEMICONDUCTOR DEVICE, MANUFACTURING METHOD THEREOF, AND ELECTRONIC DEVICE INCLUDING THE SAME", which is incorporated herein by reference in its entirety.

TECHNICAL FIELD

The present application relates generally to the field of the semiconductor, and in particular, to a vertical semiconductor device and a manufacturing method thereof, and an electronic device including the semiconductor device.

BACKGROUND

A planar semiconductor device (such as a Metal Oxide Semiconductor Field Effect Transistor (MOSFET)) is widely used in various electronic device. In the planar MOSFET, a source, a gate, and a drain of a transistor are arranged in a direction substantially parallel to a top surface of a substrate, resulting in the planar device difficult to be further scaled down its area along a horizontal direction. This is not conducive to integration of electronic device, and to reduce costs of manufacturing electronic device, thereby limiting using of the planar device. A vertical device has begun to be used, in order to solve above problems. In a vertical MOSFET, the source, the gate, and the drain of the transistor are arranged in a direction substantially perpendicular to the top surface of the substrate, thus the vertical device is easier to be scaled down.

In using the vertical device, some problems may occur as a size of the device decreases. On the one hand, a channel length of the device may also reduce as the size of the device reduces. Generally, when the channel length is less than 0.18 µm, a Short Channel Effect will become obvious, and the performance of the semiconductor device will be deteriorated. On the other hand, the gate and source/drain regions will overlap (usually in the vertical direction) as the size of the device reduces. Such overlap will increase a parasitic capacitance between the gate and source/drain regions, which affects a switch performance of the device.

SUMMARY

In view of the above, the present disclosure aims to provide, among others, a vertical semiconductor device capable of improving the Short Channel Effect of the semiconductor device and the switch performance of the semiconductor device, a method of manufacturing the same, and an electronic device including the semiconductor device.

According to a first aspect of the present disclosure, there is provided a semiconductor device comprising: a substrate; a first source/drain region, a channel region and a second source/drain region stacked on the substrate in sequence and contiguous to each other, and a gate stack formed surrounding a periphery of the channel region; wherein, spacers are respectively provided between the gate stack and the first source/drain region and between the gate stack and the second source/drain region in a form of surrounding the periphery of the channel region.

According to a second aspect of the present disclosure, there is provided a method of manufacturing a semiconductor device, comprising: forming a first material layer and a second material layer on a substrate in sequence; defining an active region of the semiconductor device on the substrate, the first material layer and the second material layer, the active region comprising a channel region; forming spacers on a top surface of the substrate and a bottom surface of the second material layer; forming a first source/drain region and a second source/drain region on the substrate and the second material layer, respectively; and forming a gate stack surrounding a periphery of the channel region.

According to a third aspect of the present disclosure, there is provided an electronic device comprising an integrated circuit formed from above semiconductor device.

According to embodiments of the present disclosure, by providing spacers between the overlapped gate stack and the source/drain regions, the parasitic capacitances between the gate stack and the source/drain regions are effectively reduced, and the switch performance of the semiconductor device is improved. By causing inner surfaces of doped areas of the source/drain regions to be located between external sides of the inner surfaces of the spacers and an external side of a surface of the periphery of the channel region, and by controlling a dope and a diffusion in the source/drain regions, so that a distance from the inner surfaces of the doped areas of the source/drain regions to external sides of the inner surfaces of the spacers is less than or equal to 10 nm, the Short Channel Effect of the semiconductor device may be improved, meanwhile, a channel resistance of the device may be reduced, and an on-state current may be increased. In addition, the problem in the prior art that it is difficult to control a gate length and a relative position between the gate stack (gate) and the source/drain region (source/drain) is solved, meanwhile, the channel of the semiconductor device may made of single crystal materials, so that a sufficiently large on-state current is ensured.

BRIEF DESCRIPTION OF THE DRAWINGS

The above and other objects, features, and advantages of the present disclosure will become more apparent from following descriptions on embodiments thereof with reference to attached drawings, in which.

Throughout the drawings, like or similar reference numerals indicate like or similar elements.

DETAILED DESCRIPTION

Figure 1:
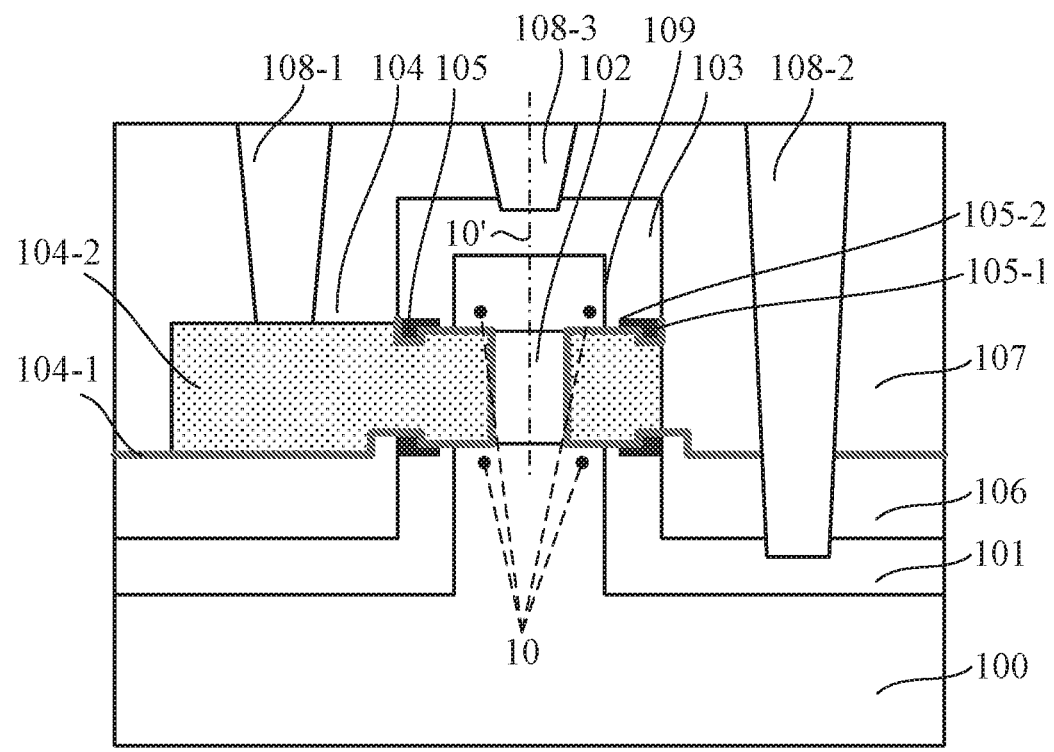
FIG. 1 is a schematic diagram showing a structure of a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

FIG. 1 is a schematic diagram showing a structure of a semiconductor device according to an embodiment of the present disclosure. As shown in FIG. 1, a vertical semiconductor device according to an embodiment of the present disclosure may include a first source/drain region 101, a channel region 102 and a second source/drain region 103 stacked on the substrate in sequence and contiguous to each other. A gate stack 104 is formed surrounding a periphery of the channel region 102. As a result, a gate length may be determined substantially by a thickness of the channel region 102 itself, rather than depending on time-consuming etching as in the prior art, and thus the gate length may be controlled by controlling the thickness of the channel region 102. Further, the channel region 102 may be formed by, for example, epitaxy, so that the thickness of the channel region 102 may be well controlled. Therefore, the gate length of the device may be well controlled.

According to an embodiment of the disclosure, spacers 105 are respectively provided between the gate stack 104 and the first source/drain region 101 and between the gate stack 104 and the second source/drain region 103 in a form of surrounding the periphery of the channel region 102. In the vertical MOSFET structure shown in FIG. 1, the gate stack 104 includes two parts, including a gate dielectric layer 104-1 and a gate conductor layer 104-2. The gate dielectric layer 104-1 generally includes a high-k gate dielectric (such as $SiO_2$ and $HfO_2$) or an oxide. The gate conductor layer 104-2 generally includes a gate conductor made of a metallic material. As shown in FIG. 1, the gate dielectric layer 104-1 is located between the gate conductor layer 104-2 and the first source/drain region 101 and the second source/drain region 103. This is equivalent to forming a capacitor at a portion where the gate stack 104 and the first source/drain region 101 and the second source/drain region 103 are overlapped. That is, a parasitic capacitance exists in the portion where the gate stack 104 and the first source/drain region 101 and the second source/drain region 103 are overlapped. The parasitic capacitance will affect a settling time of current inside the semiconductor device, resulting in an increase in a time delay when the semiconductor device is turned on, thereby affecting the switch performance of the device.

To solve this problem, in an embodiment of the disclosure, spacers 105 are provided between the gate stack 104 and the first source/drain region 101 and between the gate stack 104 and the second source/drain regions 103, respectively. According to the embodiment of the disclosure, the spacers 105 may be formed by forming insulating materials on outer surfaces of the first source/drain region 101 and the second source/drain region 103. According to another embodiment of the disclosure, the spacers 105 may be formed by performing an oxidation process or a nitridation process on base materials of the first source/drain region 101 and the second source/drain region 103. That is, the spacers 105 may be an oxide or a nitride of the base materials of the first source/drain region 101 and the second source/drain region 103. The spacers 105 increase distances of the capacitors formed between the gate stack 104 and the first source/drain region 101 and the second source/drain region 103, and thus reduce the parasitic capacitance of portions where the gate stack 104 overlaps with the first source/drain region 101 and the second source/drain region 103. Therefore, an establishment of the current inside the semiconductor device is accelerated, the time delay when the device is turned on is reduced, and the switch performance of the device is improved.

In addition, a size of the semiconductor device is required to be smaller as an integration of the semiconductor device increases. As such, the channel of the device will become short accordingly, and the proportions that PN junctions between source-substrate and/or drain-substrate sharing charges of a channel depletion region and total charges of the channel will increase, resulting in a decrease in a control ability of the gate. In order to prevent or reduce the Short Channel Effect, a shallow junction depth is usually adopted for a doped area of the planar device to reduce the influence of the PN junction between the source-substrate and the PN junction between the drain-substrate to the channel. In some embodiments of the disclosure, the first source/drain region 101 and the second source/drain region 103 are formed by a dope and diffusion process, so that the channel length defined by the doped area of the device is relatively long. Such structure reduces the proportions that the PN junctions sharing charges of a channel depletion region and total charges of the channel, so the Short Channel Effect of the device may be improved.

Specifically, the first source/drain region 101 and the second source/drain region 103 may be formed by a dope and diffusion process. As shown in FIG. 1, the doped areas of the first source/drain region 101 and the second source/drain region 103 formed by dope and diffusion are located in shallow layers of the source/drain regions (for example, in shallow layers with a doping concentration of 1E19 $cm^{-3}$~1E21 $cm^{-3}$), and the doped areas of the first source/drain region 101 and the second source/drain region 103 thus formed extend along outer surfaces of the first source/drain region 101 and the second source/drain region 103, respectively. Moreover, the portions where the gate stack 104 overlaps with the first source/drain region 101 and the second source/drain region 103 become smaller as the junction depths in the first source/drain region 101 and the second source/drain region 103 become shallow, which also contributes to reducing the parasitic capacitances between the gate stack 104 and the first source/drain region 101 and the second source/drain region 103.

However, as the junction depths of the source/drain become shallower, a control to a conductive channel becomes worse. As shown in FIG. 1, in order to form the conductive channel inside the semiconductor device, it is required to form an inversion layer or a conductive layer in undoped or lightly doped (for example, a doping concentration less than 1E19 $cm^{-3}$~1E21 $cm^3$) areas 10 of the first source/drain region 101 and the second source/drain region 103. However, when the junction depths of the source/drain are shallow; it is quite difficult to form an inversion layer or a conductive layer in undoped or lightly doped areas 10. When a voltage applied to the gate stack 104 is insufficient, it may even be impossible to establish a conductive channel at all, thereby resulting in a current interruption or an excessive resistance. In an embodiment of the disclosure, above problems are solved by configuring the size and the arrangement of the spacers 105.

Some provisions are made with respect to the following descriptions. Taking an axis 10', which passes through an approximate geometric center of the channel region 102 and is perpendicular to the top surface of the substrate 100, as a reference, surfaces of the spacers 105 relative far from the axis 10' are referred to as outer surfaces of the spacers 105, as shown by an outer surfaces 105-1 in FIG. 1; surfaces of the spacers 105 relative close to the axis 10' are referred to as inner surfaces of the spacers 105, as shown by an inner surfaces 105-2 in FIG. 1. A distance between two surfaces of each spacer 105 that are substantially parallel to the top surface of the substrate 100 is considered as a thickness of the spacer 105 (or a thickness of a spacer layer). Similarly, surfaces of the doped areas of the first source/drain region 101 and the second source/drain region 103 relative far from the axis 10' are referred to as outer surfaces of the doped areas of the first source/drain region 101 and the second source/drain region 103; surfaces of the doped areas of the first source/drain region 101 and the second source/drain region 103 relative close to the axis 10' are referred to as the inner surfaces of the doped areas of the first source/drain region 101 and the second source/drain region 103, as shown by inner surfaces 109 of the doped areas of the first source/drain region 101 and the second source/drain region 103 in FIG. 1. According to the formation principle of the first source/drain region 101 and the second source/drain region 103, the inner surfaces 109 of the doped areas of the first source/drain region 101 and the second source/drain region 103 is actually a surface of a dopant front. In addition, a direction pointing to far from a structure itself from the surfaces described above is defined as an external side. For example, the external sides of the outer surfaces 105-1 of the spacers 105 is the side departing away from the spacers 105 from the outer surfaces 105-1, and in FIG. 1 it is the side that is relative far from the axis 10'; the external sides of the inner surfaces 105-2 of the spacers 105 is the side departing away from the spacers 105 from the inner surfaces 105-2, and in FIG. 1, it is the side that is relative close to the axis 10'. Similarly, the external side of the surface of the periphery of the channel region 102 is the side departing away from the channel region 102 from the surface of the periphery of the channel region 102, i.e., the side pointed by a normal direction of the surface of the periphery of the channel region 102. The structure of the semiconductor device according to the embodiment of the disclosure will be described below in combination with above provisions and the accompanying drawings. However, it should be understood that the above provisions are intended to explain the structure of the device, so that the present disclosure may be understood by those skilled in the art more easily, and not intended to limit the structure of the device.

As shown in FIG. 1, according to an embodiment of the disclosure, the outer surfaces 105-1 of the spacers 105 and the outer surface of the first source/drain region 101 and/or the second source/drain region 103 are substantially coplanar, and the inner surfaces 105-2 of the spacers 105 are located at the external side of the surface of the periphery of the channel region 102. Such a structure may prevent the spacers 105 from blocking the channel region 102, the blocking formed by the spacers 105 affecting carrier transportations and hence the resistance of the device.

In addition, in consideration of the Short Channel Effect of the semiconductor device, the inner surfaces 109 of the doped areas of the first source/drain region 101 and the second source/drain region 103 may be located at the external side of the inner surfaces 105-2 of the spacers 105. Such a structure enables carriers in the first source/drain region 101 and the second source/drain region 103 to enter into the undoped or lightly doped areas 10 more easily to form an inversion layer or a conductive layer when a conductive channel is being established.

According to other embodiments of the disclosure, the distance from the inner surfaces 109 of the doped areas of the first source/drain region 101 and the second source/drain region 103 to the external sides of the inner surfaces 105-2 of the spacers 105 may be configured. According to an embodiment of the disclosure, the distance from the inner surfaces 109 of the doped areas of the first source/drain region 101 and the second source/drain region 103 to the external sides of the inner surfaces 105-2 of the spacers 105 is less than or equal to 10 nm. In specific embodiments, it is generally several of nanometers (nm), so as to ensure as far as possible the shallow layers of the doped areas of the first source/drain region 101 and the second source/drain region 103, and to avoid the Short Channel Effect.

In other embodiments of the disclosure, the spacers 105 are formed before the first source/drain region 101 and the second source/drain region 103 are formed. Therefore, during a formation of the spacers 105, the arrangements (positions) of the outer surfaces 105-1 and the inner surfaces 105-2 of the spacers 105 (or the distance between the outer surfaces 105-1 and the inner surfaces 105-2) is also controlled. Specifically, during the formation of the spacers 105, the distance between the outer surfaces 105-1 and the inner surfaces 105-2 of the spacers 105 formed should satisfy causing the inner surfaces 109 of the doped areas of the first source/drain region 101 and the second source/drain region 103 to be located between the external sides of the inner surfaces 105-2 of the spacers 105 and the external side of the surface of the periphery of the channel region 102. For the shallowly doped first source/drain region 101 and second source/drain region 103, the distance between the outer surfaces 105-1 and the inner surfaces 105-2 of the spacers 105 may be determined according to a doping depth of the source/drain regions. Such a structure enables carriers in the first source/drain region 101 and the second source/drain region 103 to enter into the undoped or lightly doped areas 10 more easily to form an inversion layer or a conductive layer when a conductive channel is being established, meanwhile, it may also ensure a smooth execution of subsequent processes for the first source/drain region 101 and the second source/drain region 103 for improving the Short Channel Effect. In addition, on the basis of above structure, the distance from the inner surfaces 109 of the doped areas of the first source/drain region 101 and the second source/drain region 103 to the external sides of the inner surfaces 105-2 of the spacers 105 is less than or equal to 10 nm.

The structure of the embodiment of the disclosure can effectively improve the Short Channel Effect of the device while ensuring the switch performance of the device.

According to an embodiment of the disclosure, the stacked first source/drain regions 101, the channel regions 102 and the second source/drain regions 103 are defined as a specific shape. This may be achieved by selectively etching the active region (including the first source/drain region 101, the channel region 102 and the second source/drain region 103). Generally, the active region may be a pillar, a cross section of which may be circular, square, rectangular, or polygonal, etc. As to a circular cross section, a radius of the circular cross section may be preferably 10 nm to 30 nm. As to a square cross section, a side length of the square cross section may be preferably 10 nm to 30 nm. As to a rectangular cross section, a width of the rectangle cross section may be preferably 10 nm to 30 nm, and a length of the rectangle cross section may be determined by a current magnitude of the device. Such a structure contributes to improving mobility. The structure can not only provide sufficient current of the device, but also better control the Short Channel Effect and optimize the performance of the device.

It can also be seen from FIG. 1 that only the upper portion of the substrate 100 is etched, and the lower portion of the substrate 100 may extend beyond an periphery of the upper portion. Such a structure may facilitate the formation of source/drain connections in subsequent processes. As shown in FIG. 1, the gate stack 104 is formed surrounding the periphery of the channel region 102. The periphery of the channel region 102 is recessed inwardly with respect to the periphery of the pillar active region. As a result, the formed gate stack 104 may be embedded into the recess, and during a formation of the gate stack 104, the recess may be used for self-alignment, which to a certain extent guarantees accuracy of manufacturing.

According to an embodiment of the disclosure, the channel region 102 may be composed of a single crystal semiconductor material, and the channel region 102 may include a semiconductor material different from the first source/drain region 101 and the second source/drain region 103, which facilitates processing (for example, selectively etching) to the channel region 102 when defining the active region, to form the recess for the embedded gate stack. The channel region 102 may be formed through an epitaxy process or a molecular beam epitaxy (MBE) process. The epitaxy process is preferably a low-temperature epitaxy process.

It can also be seen from FIG. 1 that the semiconductor device further includes vias that expose the gate stack 104, the first source/drain region 101 and the second source/drain region 103, respectively. A contact 108-1 for connecting the gate stack 104, a contact 108-2 for connecting the first source/drain region 101, and a contact 108-3 for connecting the second source/drain region are formed in those vias, respectively. In addition, an isolation layer 106 is further formed on the top surface of the lower portion of the first source/drain region 101 that is beyond the periphery of the upper portion thereof. A top surface of the isolation layer 106 is close to (substantially coplanar with) a surface where the first source/drain region 101 is contiguous to the channel region 102. The isolation layer 106 may be used to achieve the self-alignment of the gate stack 104 during manufacturing together with the recess on the periphery of the channel region 102, which will be explained in detail later. An interlayer dielectric layer 107 is further formed on the uppermost part of the MOSFET structure, which is used for an isolation and a protection of the device.

The present disclosure may be implemented in various forms, some of which are described below.

FIGS. 2-14 are schematic diagrams showing a flow of manufacturing a semiconductor device according to an embodiment of the present disclosure. The manufacturing process is described in detail below with reference to the drawings.

Figure 2:
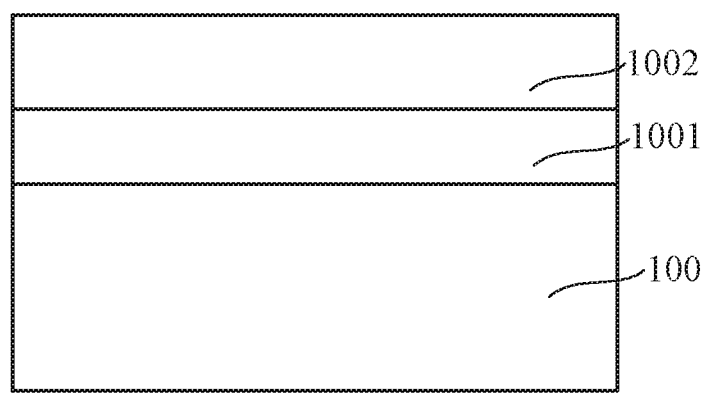
FIGS. 2-14 are schematic diagrams showing a flow of manufacturing a semiconductor device according to an embodiment of the present disclosure.

As shown in FIG. 2, a substrate 100 is provided. The substrate 100 may be of various types, including but not limited to, a bulk semiconductor substrate such as a bulk Si substrate, a semiconductor on insulator (SOI) substrate, a compound semiconductor substrate such as a SiGe substrate, and the like. In the embodiment of the disclosure, the bulk Si substrate will be described by way of example for convenience of description. The substrate 100 may be used to form a first source/drain region 101.

On the substrate 100, a first material layer 1001 and a second material layer 1002 may be formed in sequence. In a specific embodiment, the first material layer 1001 and the second material layer 1002 may be formed in sequence by an epitaxy process. For example, a first material layer 1001 is first formed on the provided substrate 100 through epitaxy. The first material layer 1001 may be used to form a channel region 102, and the thickness of the channel region 102 may be used to define a gate length. In the embodiment of the disclosure, the first material layer 1001 may be a SiGe layer having a thickness of about 10 nm to 100 nm and a Ge content of about 10% to 40%. A second material layer 1002 is then formed on the first material layer 1001 through epitaxy. The second material layer 1002 may be used to form the second source/drain region 103. In the embodiment of the disclosure, the second material layer 1002 may be a Si layer having a thickness of about 20 nm to 50 nm. It should be noted that the disclosure is not limited thereto, and kinds and thicknesses of those material layers may be changed. For example, when above three material layers are formed through an epitaxy process, it is required only to ensure using different materials and components for those three material layers from each other.

In an embodiment of the disclosure, each material layer is preferably formed through an epitaxy process or a molecular beam epitaxial process. The epitaxy process is preferably a low temperature epitaxy process. By using the epitaxy process to form each material layer, the thickness of the material layer may be well controlled. Since the gate length of the semiconductor device is determined by the thickness of the channel region 102, the gate length may be controlled more accurately. In addition, in the embodiment of the disclosure, the channel region 102 is made of a single crystal semiconductor material, which contributes to reducing the resistance of the device.

It should be noted that, in order to ensure the subsequent processes (for example, forming a recess on the periphery of the channel region 102), the material of the first material layer 1001 should be capable of being etched selectively relative to the materials of the substrate 100 and the second material layer 1002.

Figure 3A:
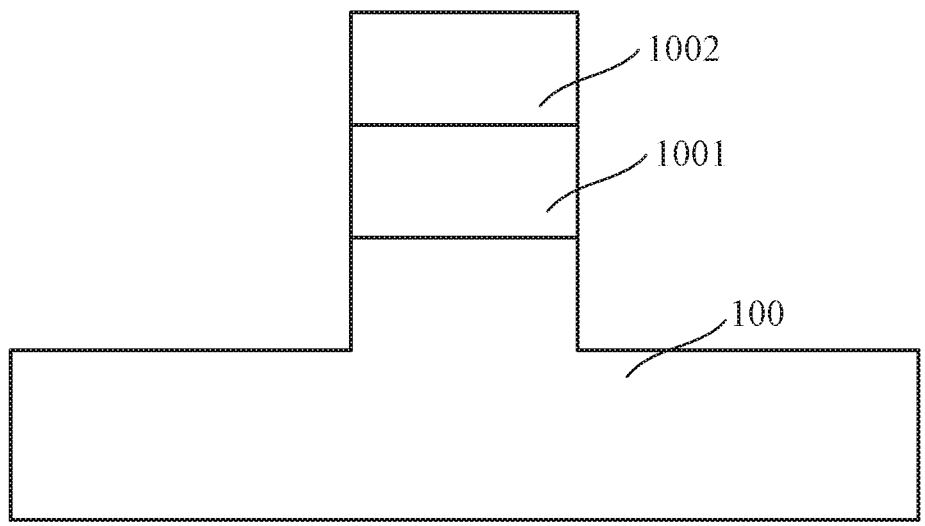
Figure 3B:
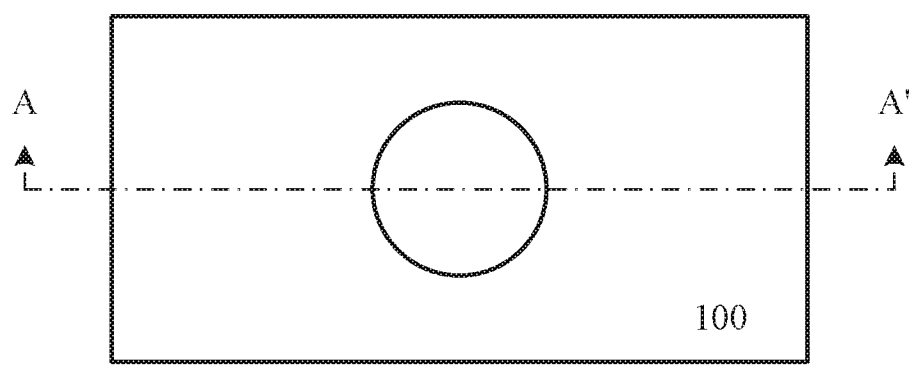

Next, an active region of the device may be defined. The active region of the device includes the first source/drain region 101, the channel region 102 and the second source/drain region 103. Defining the active region includes defining the shape of the active region. Specifically, as shown in FIG. 3a and FIG. 3b (FIG. 3a is a sectional view, FIG. 3b is a top view, and a line AA' in FIG. 3b indicates a location where the sectional view is taken), a photoresist (not shown) may be formed on a stack of the substrate 100, the first material layer 1001 and the second material layer 1002 shown in FIG. 2, and then patterned into a desired shape by photolithography (exposing and developing). The second material layer 1002, the first material layer 1001 and a part of the substrate 100 are selectively etched by, for example, reactive ion etching (RIE) in sequence with the patterned photoresist as a mask. The etching proceeds to the upper portion of the substrate 100, and the second material layer 1002, the first material layer 1001 and the upper portion of the substrate 100 form a pillar shape after being etched. RIE may be performed, for example, in a direction substantially perpendicular to the surface of the substrate 100, so that the pillar shape extends in the direction substantially perpendicular to the surface of the substrate 100 either. After etching is completed, the photoresist is removed.

As can be seen from the top view of FIG. 3b, in the embodiment, a cross section of the active region is substantially of a circular shape, that is, the periphery of the active region is an approximately cylindrical. The radius of the circular cross section may be preferably 10 nm to 30 nm. In other embodiments, when the cross section of the active region is a square, a side length of the square may be preferably 10 nm to 30 nm. When the cross section of the active region is a rectangle, a width of the rectangle (in vertical direction in the plane on which FIG. 3b is presented) may be preferably 10 nm to 30 nm, and a length of the rectangle (in horizontal direction in the plane on which FIG. 3b is presented) is determined by current magnitude of the device. Such a structure contributes to improving mobility. The structure can not only provide sufficient current of the device, but also better control the Short Channel Effect and optimize the performance of the device. The shape of the active region is, of course, not limited thereto, other shapes may be formed according to a design layout. For example, the cross section of the active region may be oval, polygonal, or the like.

Figure 4:
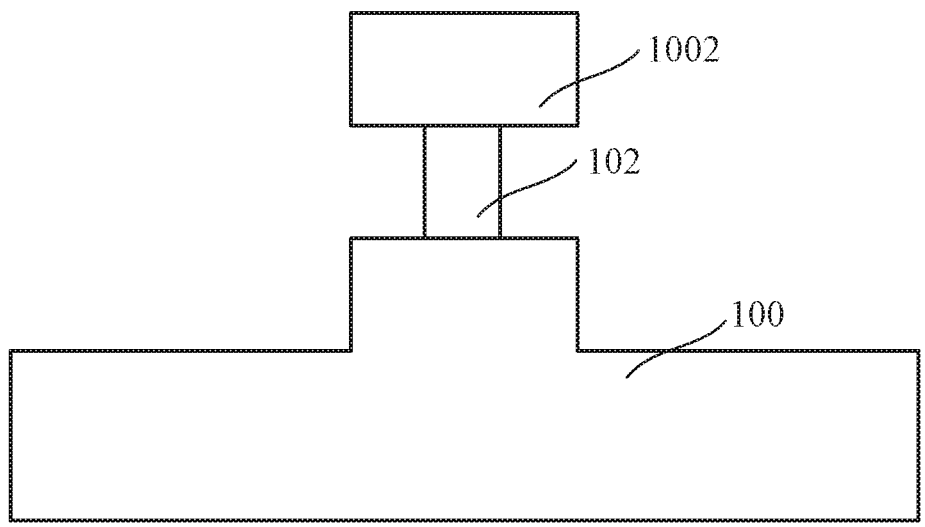

Next, as shown in FIG. 4, the first material layer 1001 in FIG. 3 is recessed inwardly with respect to the pillar active region (that is, in a direction opposite to the normal direction of the peripheral surface of the pillar active region) to form a channel region 102. This may be achieved by selectively etching the first material layer 1001 relative to the substrate 100 and the second material layer 1002.

In an embodiment, a selective etching method based on a modifier may be used. Specifically, An entire stacked structure formed in foregoing process steps is first put into a surface modifier. The modifier may include a liquid solution or an aqueous solution of one or a combination several of ozone ($O_3$), potassium permanganate ($KMnO_4$), potassium dichromate ($K_2Cr_2O_7$), nitric acid ($HNO_3$), sulfuric acid ($H_2SO_4$), and hydrogen peroxide ($H_2O_2$), an oxygen-containing gas, or an oxygen-containing plasma. Through a reaction between the modifier and the semiconductor material, a modified layer in the form of an oxide (for example, SiGeO formed on the surface of SiGe) is formed on the surfaces of the substrate 100, the first material layer 1001 and the second material layer 1002. Generally, the semiconductor surface on which the modified layer is formed is also cleaned after the modified layer is formed. Then, the modified layer is removed with an etchant, and the semiconductor surface after the modified layer is removed is cleaned. The etchant used may include hydrofluoric acid, buffered hydrofluoric acid, BOE, hydrofluoric acid vapor, halogen hydride, or vapor thereof. A cleaning agent used may include water, high-purity deionized water, ethanol, acetone, and the like. Since the first material layer 1001 has a faster oxidation rate, the first material layer 1001 forms a recess with respect to the substrate 100 and the second material layer 1002 after the modified layer is removed. Whether the etching has reached a preset depth is checked. If the preset depth is not reached, the process steps of forming a modified layer using a modifier and etching the modified layer are repeated until the preset depth and etching requirements are reached. This method may accurately control a thickness for etching during a semiconductor processing (≤0.5 nm), and increase an etching rate. The stacked structure after being etched is shown in FIG. 4. The first material layer 1001 that is recessed inwardly is used as the channel region 102, and on the periphery of the channel region 102, there located a recessed structure surrounding the periphery.

Figure 5:
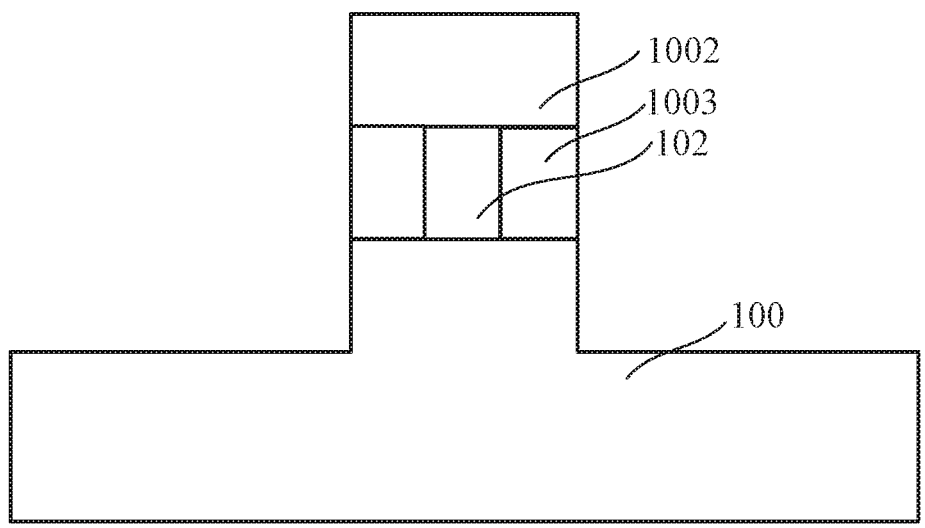

Next, spacers 105 may be formed on the top surface of the substrate 100 (the top surface where the substrate 100 is contiguous to the channel region 102) and on the bottom surface of the second material layer 1002. First, as shown in FIG. 5, a different material is filled into the recess formed in FIG. 4, which is referred to as a sacrificial layer 1003 (the sacrificial layer 1003 is usually referred to as a dummy gate, because it will be replaced by a metal gate later). The sacrificial layer 1003 is mainly used to prevent subsequent processing from affecting the channel region 102 and from leaving unnecessary materials in the recess thus to affect a subsequent formation of a gate stack. In an embodiment, the recess may be filled with SiC, which is formed by depositing a SiC material layer on the structure shown in FIG. 4, and then performing an etchback by such as RIE on the deposited SiC material layer. The etchback may be performed in a direction substantially perpendicular to the top surface of the substrate 100. The SiC filled occupies a space where the gate stack 104 is to be formed in a subsequent process, and a surface of the peripheral of the sacrificial layer 1003 is substantially coplanar with a surface of the peripheral of the pillar active region.

It should be noted that the material used for the sacrificial layer 1003 is not limited to SiC, and other materials may be used so long as they can be selectively etched relative to the materials of the substrate 100 and the second material layer 1002.

Figure 6:
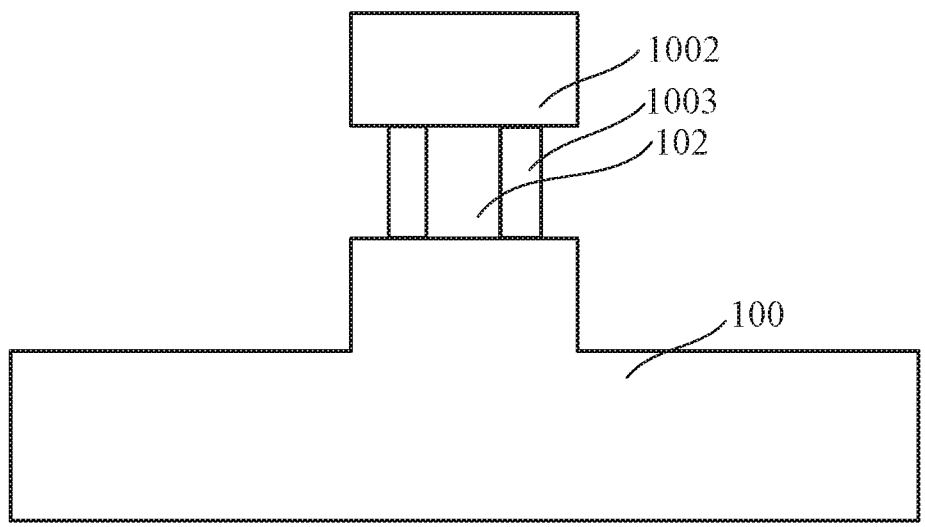

Next, the sacrificial layer 1003 is etched back to form a recessed sacrificial layer 1003, as shown in FIG. 6. In an embodiment, a thickness of the recessed sacrificial layer 1003 in a direction perpendicular to the surface of the periphery of the channel region 102 may be controlled, thereby the distance between outer surfaces 105-1 and inner surfaces 105-2 of the spacers 105 to be formed being controlled. Specifically, the thickness of the recessed sacrificial layer 1003 in a direction perpendicular to the surface of the periphery of the channel region 102 satisfies a set thickness, so that the inner surfaces 105-2 of the spacers 105 are located at an external side of the surface of the periphery of the channel region 102, and the distance between the outer surfaces 105-1 and the inner surfaces 105-2 of the spacers 105 may meet a shallow doping for the source/drain regions.

Figure 7:
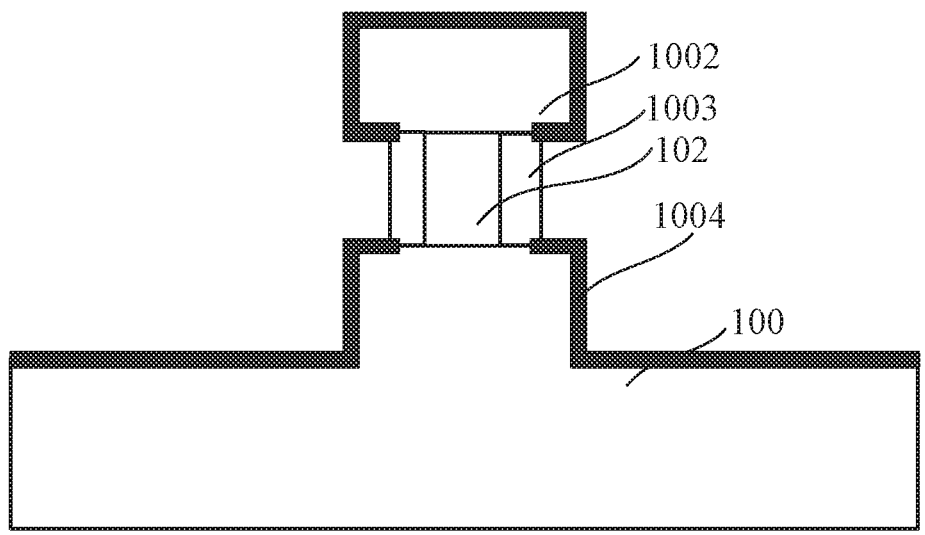

Next, a top surface of the substrate 100 and an outer surface of the second material layer 1002 are processed to form a spacer layer 1004 on the top surface of the substrate 100 and the outer surface of the second material layer 1002, as shown in FIG. 7, The process performed on the top surface of the substrate 100 and the outer surface of the second material layer 1002 may include a nitridation process. In an embodiment, the nitridation process may be performed by a thermal nitridation process or a plasma enhanced nitridation process. The spacer layer 1004 formed is a nitride layer of the material of the substrate 100 and the material of the second material layer 1002 (the spacers 105 to be formed are a nitride of the material of the substrate 100 and the material of the second material layer 1002), and the thickness of the nitride layer formed may be 2 nm to 10 nm.

In another embodiment of the disclosure, the process performed on the top surface of the substrate 100 and the outer surface of the second material layer 1002 may include an oxidation process. The spacer layer 1004 formed is an oxide layer of the material of the substrate 100 and the material of the second material layer 1002 (the spacers 105 to be formed are an oxide of the material of the substrate 100 and the material of the second material layer 1002), and the thickness of the oxide layer formed may be 2 nm to 10 nm.

In still another embodiment of the disclosure, a material with a predetermined thickness used for forming the spacer layer 1004 may be selectively grown on the top surface of the substrate 100 and the outer surface of the second material layer 1002 other than the surface of the periphery of the recessed sacrificial layer 1003. An oxidation process or a nitridation process is then applied to the material used for forming the spacer layer 1004 to generate a corresponding oxide or nitride (insulating material). For example, SiGe may be selectively grown on the top surface of the substrate 100 and the outer surface of the second material layer 1002 other than the surface of the periphery of the recessed sacrificial layer 1003. In an embodiment, a thickness of the SiGe material layer is preferably 1 nm to 5 nm, with a Ge content is 10% to 30%. The SiGe is then oxidized to completely or partially turn the SiGe material layer into an insulating dielectric layer (Note: the insulating dielectric layer here does not necessarily include semiconductor materials of the substrate (the first source/drain region 101) and/or the second material layer (the second source/drain region 103)). In addition, when the material used for forming the spacer layer 1004 is selectively grown, it may be grown in a place that is close to the surface of periphery of the recessed sacrificial layer 1003, except for the surface of the periphery of the recessed sacrificial layer 1003. The material used for forming the spacer layer 1004 is preferably grown on only a part of the top surface of the substrate 100 and on the bottom surface of the second material layer 1002.

However, the embodiment of the present disclosure is not limited thereto, that is, the top surface of the substrate 100 and the outer surface of the second material layer 1002 may be processed through other methods to form the spacers 105 as dielectrics between the gate stack 104 and the first source/drain region 101 and the second source/drain region 103. Since a parasitic capacitance is reduced as a thickness of a dielectric layer between the gate stack 104 and the first source/drain region 101 and the second source/drain region 103 is increased, a time delay when the device is turned on is reduced, and a switch performance of the device is improved.

Figure 8:
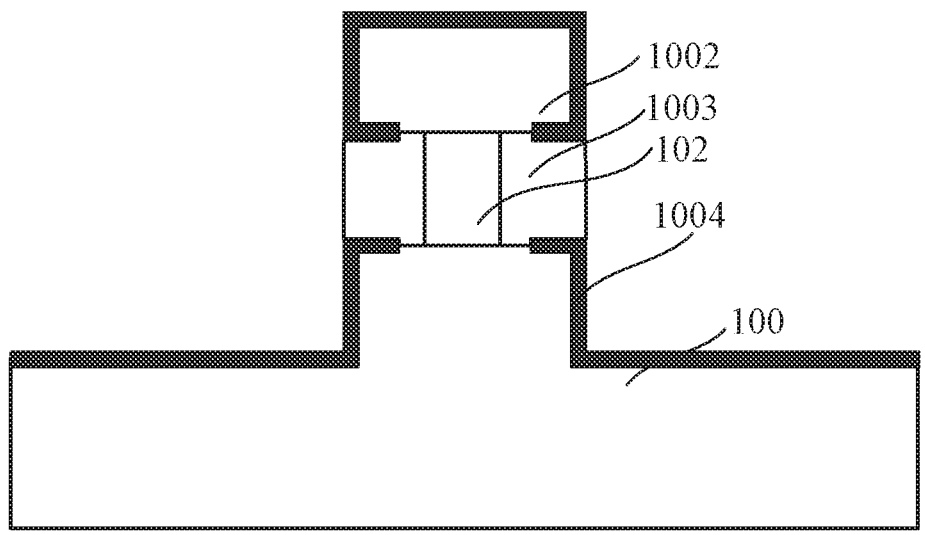
Figure 9:
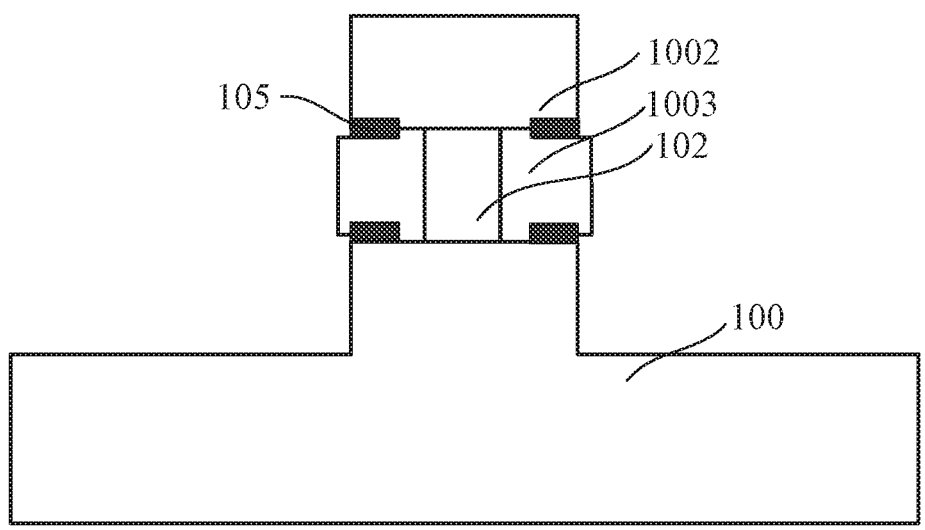

Next, in a recess formed by the recessed sacrificial layer 1003 and a part of the spacer layer 1004, the sacrificial layer 1003 continues being formed. Generally, the same material as the recessed sacrificial layer 1003 formed in the foregoing process steps may be selected to form the sacrificial layer 1003 again. In an embodiment, the sacrificial layer 1003 may be formed by depositing a SiC material layer on the structure shown in FIG. 7, and then etching back the deposited SiC material layer by such as RIE. The direction of the etchback is substantially perpendicular to the top surface of the substrate 100. A surface of the periphery of the sacrificial layer 1003 formed is substantially coplanar with the outer surface of the spacer layer 1004 formed on the surface of the periphery of the pillar active region, as shown in FIG. 8. The filled SiC occupies the recess surrounding the periphery of the channel region 102, and may form a protection for the spacer layer 1004 within the recess. In this way, when the spacer layer 1004 exposed externally is removed, the spacer layer 1004 within the recess may be prevented from being etched off. As a result, spacers 105 are formed on the top surface of the substrate 100 (the surface where the substrate 100 is contiguous to the channel region 102) and the bottom surface of the second material layer 1002, as shown in FIG. 9.

Figure 10:
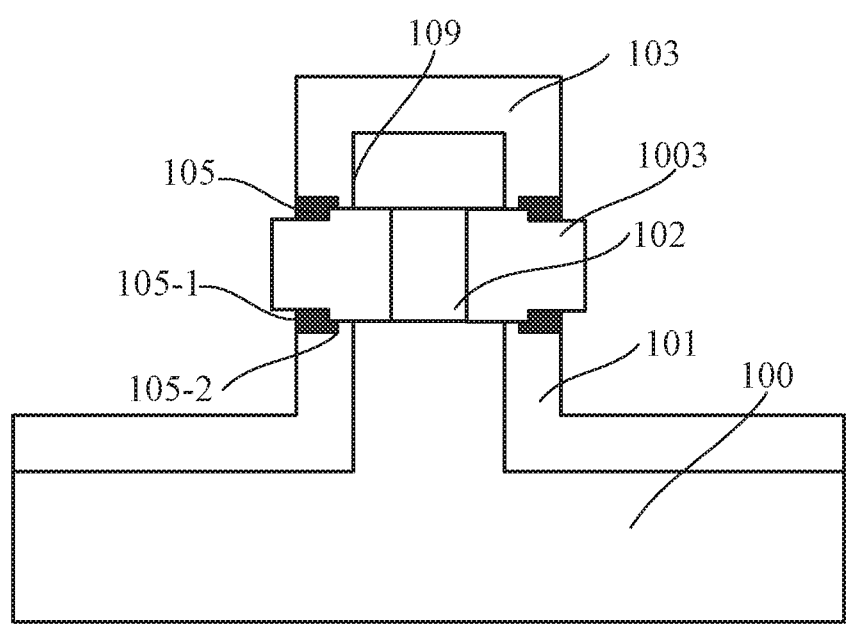

Next, a first source/drain region 101 and a second source/drain region 103 are formed on the substrate 100 and the second material layer 1002, respectively. In an embodiment, a dopant film is first formed on the outer surface of the stacked structure, encompassing outer surfaces of the substrate 100, the sacrificial layer 1003 and the second material layer 1002. The dopant film may be deposited through process such as chemical vapor deposition (CVD), atomic layer deposition (ALD), or plasma doping. For an n-type FET, an n-type dopant film may be used, and for a p-type FET, a p-type dopant film may be used. An annealing process is then used to drive the dopant in the dopant film to diffuse into the source/drain regions, so as to form doped source/drain regions. Generally, doped areas are doped regions with a doping concentration of 1E19 cm$^{-3}$ to 1E21 cm$^{-3}$, As shown in FIG. 10, a doped area of the source/drain region is formed in a shallow layer surrounding the surface of the periphery of the active region in the upper portion of the substrate 100 and in a shallow layer in the top surface of the lower portion of the substrate 100, which is the first source/drain region 101 in the embodiment of the present disclosure. Another doped area of the source/drain region is formed in a shallow layer in the outer surface of the second material layer 1002, which is the second source/drain region 103 in the embodiment of the present disclosure. The first source/drain region 101 and the second source/drain region 103 are both source/drain regions with a shallow junction depth, which contributes to improving the Short Channel Effect of the device. After the dope process and the diffusion process is completed, the dopant film is removed.

According to an embodiment of the disclosure, when performing the annealing process to drive the dopant film to diffuse, a diffusion of the dopant is controlled. Specifically, as shown in FIG. 10, when performing the annealing process to drive the dopant film to diffuse, a diffusion of surfaces of a dopant front in the first source/drain region 101 and the second source/drain region 103 may be controlled, so as to cause the inner surfaces 109 of the doped areas of the first source/drain region 101 and the second source/drain region 103 to be located at the external sides of the inner surfaces 105-2 of the spacers 105, forming an extension of the device. In an embodiment, when performing the annealing process to drive the dopant film to diffuse, a diffusion of the dopant is controlled, so as to cause the inner surfaces 109 of the doped areas of the first source/drain region 101 and the second source/drain region 103 to be located between the external sides of the inner surfaces 105-2 of the spacers 105 and the external side of the surface of the periphery of the channel region 102. In another embodiment, the distance from the inner surfaces 109 of the doped areas of the first source/drain region 101 and the second source/drain region 103 to the external sides of the inner surfaces 105-2 of the spacers 105 are less than or equal to 10 nm, for example, several of nanometers (nm). Such a structure enables carriers in the first source/drain region 101 and the second source/drain region 103 to enter into the undoped or lightly doped areas 10 more easily to form an inversion layer or a conductive layer, which contributes to reducing the resistance of the device and increasing the current of the device.

Figure 11:
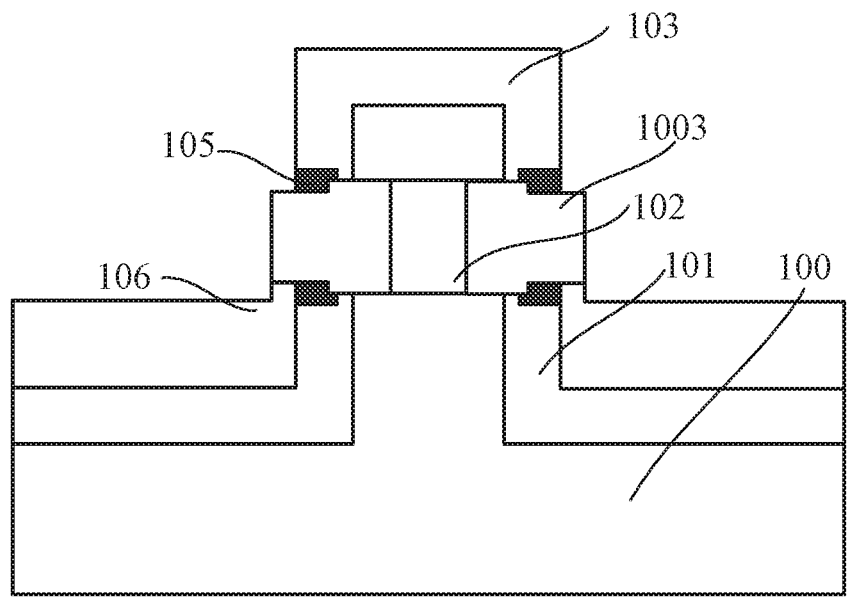

Next, an isolation layer may be formed surrounding the active region to achieve electrical isolation. For example, as shown in FIG. 11, an oxide may be deposited on the top surface of the lower portion of the substrate 100. The oxide is etched back to form an isolation layer 106, and the etchback stops at a surface where the first source/drain region 101 is contiguous to the channel region 102. As a result, a top surface of the isolation layer 106 formed may be substantially coplanar with the surface where the first source/drain region 101 is contiguous to the channel region 102. In other embodiments, the top surface of the isolation layer 106 formed may be slightly higher than the surface where the first source/drain region 101 is contiguous to the channel region 102. Prior to etchback, the oxide deposited may be planarized by, for example, chemical mechanical polishing (CMP) or sputtering.

In some embodiments of the disclosure, before the isolation layer is formed, the source and the drain silicidation may be performed to reduce resistance. The source and the drain silicidation refers to forming a layer of metal silicide on the substrate 100 before the isolation layer is formed. In an embodiment, Ni or NiPt may be first deposited on the substrate 100, NiSi or NiPtSi is then formed by annealing, and unreacted metals are finally removed.

During a formation of the isolation layer 106, the sacrificial layer 1003 may be retained to prevent the material of the isolation layer 106 from entering into the recess which is used to accommodate the gate stack. Next, the sacrificial layer 1003 may be removed to release the space in the recess, which may be achieved, for example, by selectively etching the material (for example, SiC) of the sacrificial layer 1003.

Figure 12:
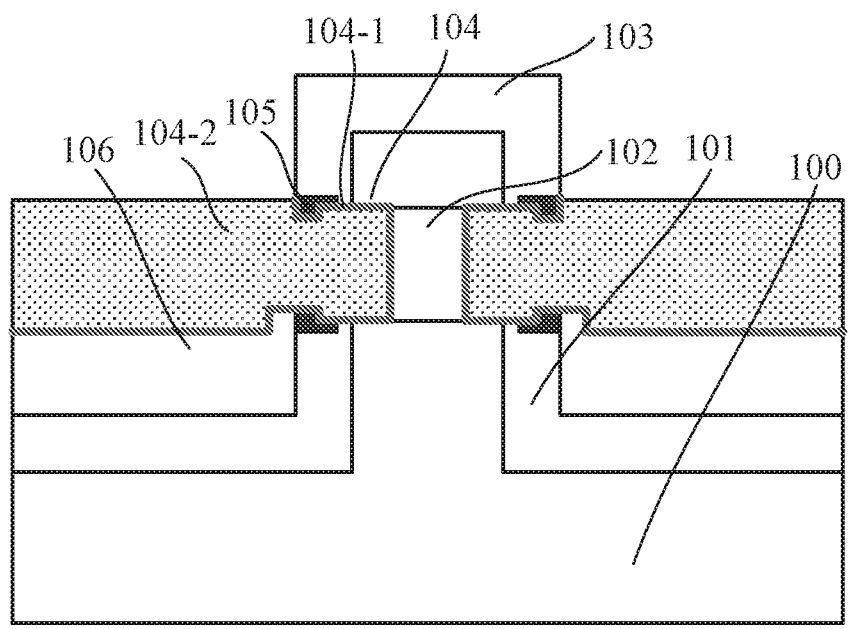

Next, a gate stack 104 is formed surrounding the periphery of the channel region 102. Specifically, as shown in FIG. 12, the gate stack 104 may be formed by depositing in sequence a gate dielectric layer 104-1 and a gate conductor layer 104-2 on the structure shown in FIG. 11 (with the sacrificial layer 1003 removed), and etching the gate conductor 104-2. The gate dielectric layer 104-1 may include an interface layer (for example, $SiO_2$) and a high-k material layer (for example, $HfO_2$). In an embodiment, an ALD process may be used to form or deposit a $SiO_2$ layer (about 0.2 nm to 1.5 nm) and a $HfO_2$ layer (about 1 nm to 5 nm) on the top surface of the isolation layer 106 and in the recess. When the gate conductor layer 104-2 is etched, a top surface of the gate conductor layer 104-2 is preferably controlled to be between a top surface and a bottom surface of the spacer 105 located on a bottom surface of the second source/drain region 103. Such a structure contributes to reducing a capacitance between the gate stack 104 formed and the second source/drain region 103, while ensuring the gate stack 104 formed not too thin, so that a resistance of the gate stack 104 may be controlled. In addition, a work function adjustment layer may further be formed between the gate dielectric layer 104-1 and the gate conductor layer 104-2, which is not repeated here.

Figure 13:
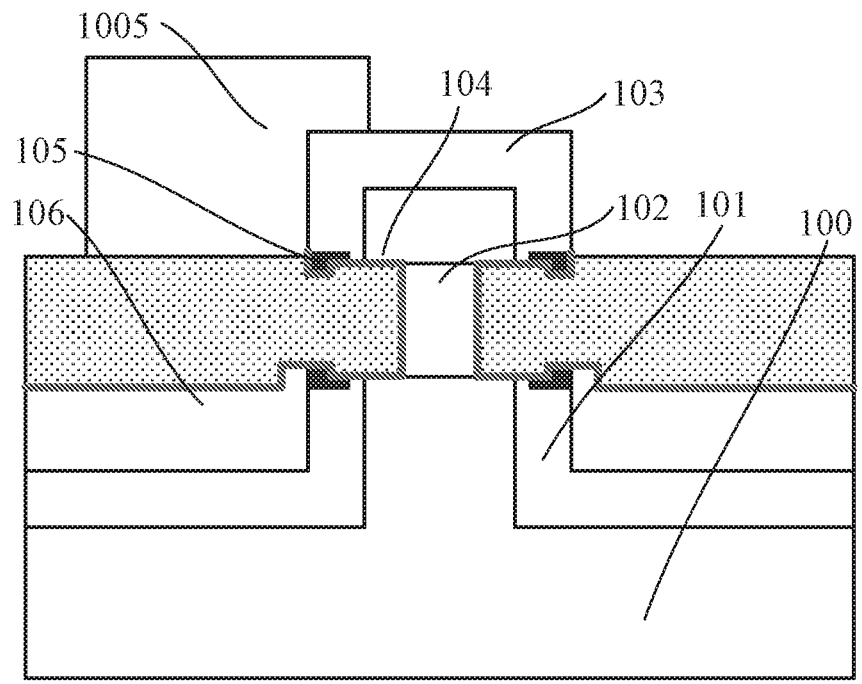
Figure 14:
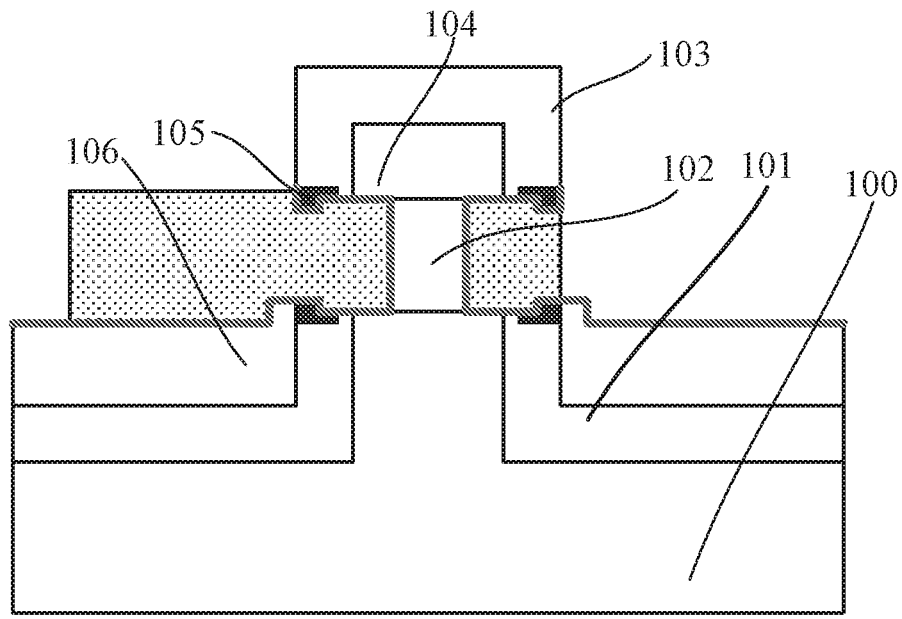

Next, the gate stack 104 may be adjusted in shape to facilitate manufacturing of contacts later. For example, as shown in FIG. 13, a photoresist 1005 may be formed on the structure shown in FIG. 12. The photoresist 1005 is patterned, for example, by photolithography so that a part of the gate stack 104 exposed outside the recess (in this example, the left portion in the figure) is covered, and the other part of the gate stack 104 exposed outside the recess (in this example, the right part of the figure) is kept exposed. Then, the gate stack 104 may be selectively etched by, for example, RIE with the photoresist 1005 as a mask. In this way, in addition to a portion which remains in the recess, the portion which is covered by the photoresist 1005 is left, as shown in FIG. 14. Subsequently, an electrical connection to the gate stack 104 may be achieved by the portion left. After that, the photoresist 1005 may be removed.

Next, referring back to FIG. 1, an interlayer dielectric layer 107 is formed on the structure shown in FIG. 14. For example, an interlayer dielectric layer 107 may be formed by depositing and planarizing (such as CMP) an oxide. In the interlayer dielectric layer 107, the contact 108-2 to the first source/drain region 101, the contact 108-3 to the second source/drain region 103 and the contact 108-1 to the gate stack 104 may be formed, respectively. These contacts may be formed by etching vias in the interlayer dielectric layer 107 and the isolation layer 106 and filling them with a conductive material such as a metal.

Since the gate stack 104 extends beyond the periphery of the active region, it is relatively easy to form the contact 108-1 thereto. In addition, since the lower portion of the first source/drain region 101 extends beyond the periphery of the pillar active region, that is, at least a part of the first source/drain region 101 is not covered by the gate stack 104, it may be easy to form the contact 108-2 thereto.

The semiconductor device according to the embodiments of the present disclosure is applicable to various electronic devices. For example, an Integrated Circuit (IC) may be formed by integrating a plurality of such semiconductor devices and also other devices (for example, transistors in other forms or the like), from which an electronic device may be made. Therefore, the present disclosure further provides an electronic device comprising the above semiconductor device. The electronic device may also comprise components such as a display operatively coupled to the IC and a wireless transceiver operatively coupled to the IC, or the like. Such an electronic device may comprise, for example, a smart phone, a computer, a tablet Personal Computer (PC), an artificial intelligence device, a wearable device, a mobile power supply, or the like.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A semiconductor device, comprising:
   a substrate;
   a first source/drain region, a channel region and a second source/drain region stacked on the substrate in sequence and contiguous to each other, and a gate stack formed surrounding a periphery of the channel region;
   wherein spacers are respectively provided between the gate stack and the first source/drain region and between the gate stack and the second source/drain region in a form of surrounding the periphery of the channel region, and outer surfaces of the spacers are substantially coplanar with outer surfaces of the first source/drain region and/or the second source/drain region.

2. The semiconductor device of claim 1, wherein inner surfaces of the spacers are located at an external side of a surface of the periphery of the channel region.

3. The semiconductor device of claim 1, wherein the spacers are formed by insulating materials.

4. The semiconductor device of claim 1, wherein the spacers comprise oxides or nitrides of base materials of the first source/drain region and/or the second source/drain region.

5. The semiconductor device of claim 4, wherein the spacers are formed by performing an oxidation process or a nitridation process on base materials of the first source/drain region and the second source/drain region.

6. The semiconductor device of claim 4, wherein a thickness of a film layer of an oxide or a nitride is 2 nm to 10 nm.

7. The semiconductor device of claim 1, wherein a doped area of the first source/drain region and a doped area of the second source/drain region extend respectively along outer surfaces of the first source/drain region and the second source/drain region.

8. The semiconductor device of claim 1, wherein inner surfaces of doped areas of the first source/drain region and the second source/drain region are located at external sides of inner surfaces of the spacers.

9. The semiconductor device of claim 1, wherein inner surfaces of doped areas of the first source/drain region and the second source/drain region are located between external sides of inner surfaces of the spacers and an external side of a surface of the periphery of the channel region.

10. The semiconductor device of claim 9, wherein distances from the inner surfaces of the doped areas of the first source/drain region and the second source/drain region to the external sides of the inner surfaces of the spacers are less than or equal to 10 nm.

11. The semiconductor device of claim 1, wherein the channel region comprises a single crystal semiconductor material.

12. The semiconductor device of claim 1, wherein a semiconductor material of the channel region is different from that of the first source/drain region and/or the second source/drain region.

13. An electronic device comprising an integrated circuit comprising the semiconductor device of claim 1.

14. The electronic device of claim 13, wherein the electronic device comprises a smartphone, a computer, a tablet computer, an artificial intelligence device, a wearable device, or a mobile power supply.

15. A method of manufacturing a semiconductor device, comprising:
forming a first material layer and a second material layer on a substrate in sequence;
defining an active region of the semiconductor device on the substrate, the first material layer and the second material layer, the active region comprising a channel region;
forming spacers identically on a top surface of the substrate and a bottom surface of the second material layer;
forming a first source/drain region and a second source/drain region on the substrate and the second material layer respectively; and
forming a gate stack surrounding a periphery of the channel region.

16. The method of claim 15, wherein defining an active region of the semiconductor device on the substrate, the first material layer and the second material layer comprises:
etching the second material layer, the first material layer and an upper portion of the substrate to form a pillar active region, and causing a lower portion of the substrate to extend beyond a periphery of the pillar active region; and
etching the first material layer so that the first material layer is recessed inwardly with respect to the periphery of the pillar active region to form the channel region.

17. The method of claim 16, wherein etching the first material layer so that the first material layer is recessed inwardly with respect to the periphery of the pillar active region to form the channel region comprises:

forming a modified layer on outer surfaces of the substrate, the first material layer and the second material layer with a modifier at least once; and
etching the modified layer at least once so that the first material layer is recessed inwardly with respect to the periphery of the pillar active region to form the channel region.

18. The method of claim 17, wherein forming spacers on a top surface of the substrate and a bottom surface of the second material layer comprises:
forming a sacrificial layer in a recess formed by the first material layer that is recessed inwardly with respect to the periphery of the pillar active region;
etching back the sacrificial layer to form a recessed sacrificial layer;
processing the top surface of the substrate and an outer surface of the second material layer to form a spacer layer on the top surface of the substrate and the outer surface of the second material layer;
continuing forming the sacrificial layer in a recess formed by the recessed sacrificial layer and a part of the spacer layer, a surface of a periphery of the sacrificial layer formed again being substantially coplanar with an outer surface of the spacer layer formed on a surface of the periphery of the pillar active region; and
removing the spacer layer exposed externally to form the spacers on the top surface of the substrate and the bottom surface of the second material layer.

19. The method of claim 18, wherein the processing the top surface of the substrate and an outer surface of the second material layer comprises:
on a part of surfaces of the top surface of the substrate and the outer surface of the second material layer except for a surface of a periphery of the recessed sacrificial layer, selectively growing a material with a predetermined thickness used for forming the spacer layer; and
processing the material with a predetermined thickness used for forming the spacer layer to partially turn the material into an insulating material.

20. The method of claim 19, wherein the processing the material used for forming the spacer layer comprises an oxidation process or a nitridation process.

21. The method of claim 20, wherein the processing comprises the oxidation process or the nitridation process, and the spacers comprise oxides or nitrides of materials of the substrate and the second material layer.

22. The method of claim 21, wherein a thickness of the spacer layer is 2 nm to 10 nm.

23. The method of claim 22, wherein the forming a first source/drain region and a second source/drain region on the substrate and the second material layer respectively comprises:
depositing a dopant film on the top surface of the substrate and an outer surface of the pillar active region comprising the spacers and the sacrificial layer;
annealing to drive the dopant film to diffuse to form the first source/drain region and the second source/drain region respectively on the upper portion of the substrate and on the second material layer; and
removing the dopant film.

24. The method of claim 23, wherein when the annealing to drive the dopant film to diffuse, a diffusion of the dopant is controlled so that inner surfaces of doped areas of the first source/drain region and the second source/drain region are located at external sides of inner surfaces of the spacers.

25. The method of claim 23, wherein when the annealing to drive the dopant film to diffuse, a diffusion of the dopant is controlled so that inner surfaces of doped areas of the first source/drain region and the second source/drain region are located between external sides of inner surfaces of the spacers and an external side of the surface of the periphery of the channel region.

26. The method of claim 25, wherein when the annealing to drive the dopant film to diffuse, a diffusion of the dopant is controlled so that distances from inner surfaces of doped areas of the first source/drain region and the second source/drain region to external sides of inner surfaces of the spacers are less than or equal to 10 nm.

27. The method of claim 23, wherein the forming a gate stack surrounding a periphery of the channel region comprises:
- removing the sacrificial layer;
- depositing a gate dielectric layer and a gate conductor layer in sequence; and
- etching back the gate dielectric layer and the gate conductor layer to form the gate stack surrounding the periphery of the channel region.

28. The method of claim 27, before removing the sacrificial layer, further comprising:
- on a top surface of a part of the lower portion of the substrate that is beyond the pillar
- active region, forming an isolation layer surrounding the pillar active region, wherein a top
- surface of the isolation layer is substantially coplanar with a surface where the first source/drain region is contiguous to the channel region.

* * * * *